United States Patent [19]

Suppelsa et al.

[11] Patent Number: 5,421,083
[45] Date of Patent: Jun. 6, 1995

[54] METHOD OF MANUFACTURING A CIRCUIT CARRYING SUBSTRATE HAVING COAXIAL VIA HOLES

[75] Inventors: Anthony B. Suppelsa; Anthony J. Suppelsa, both of Coral Springs; Fadia Nounou, Plantation, all of Fla.

[73] Assignee: Motorola, Inc., Schaumburg, Ill.

[21] Appl. No.: 221,593

[22] Filed: Apr. 1, 1994

[51] Int. Cl.6 .................................. H05K 3/10
[52] U.S. Cl. ........................... 29/852; 29/828; 174/36; 174/250
[58] Field of Search .................. 29/852, 828, 850; 174/35, 36, 250, 251

[56] References Cited

U.S. PATENT DOCUMENTS

| | | | |
|---|---|---|---|
| 4,642,889 | 2/1987 | Grabbe | 29/840 |
| 4,675,788 | 2/1987 | Breitling et al. | 174/36 |
| 4,776,087 | 10/1988 | Cronin et al. | 29/828 |
| 5,233,133 | 8/1993 | Iwasaki et al. | 174/250 |
| 5,323,534 | 6/1994 | Iwasaki et al. | 29/850 |
| 5,363,550 | 11/1994 | Aitken et al. | 29/852 X |

*Primary Examiner*—Carl J. Arbes
*Attorney, Agent, or Firm*—Dale W. Dorinski

[57] ABSTRACT

A method of manufacturing a circuit carrying substrate having one or more coaxial via holes. The center core or inner layer (330) of the circuit carrying substrate is a dielectric material that has a plated (339) through hole or via (335) coupling the two surfaces of the inner layer together. One side of the inner layer has a first metallization pattern (336) and the other side has a second metallization pattern (338) on it. The through hole is electrically conductive (339) and connects portions of the first and second metallization patterns. The plated through hole is filled with a dielectric material (340). A first dielectric layer (342) is formed on one side of the inner layer, and a second dielectric layer (344) is formed on the other side of the inner layer, so that the dielectric layers cover the first and second metallization patterns and the filled via hole. A third metallization pattern (350) is formed on the first dielectric layer, and a fourth metallization pattern (360) is formed on the second dielectric layer. A second via hole (370) is formed within the first via hole, substantially concentric to and electrically insulated from the first via hole, to electrically connect the third and fourth metallization patterns.

10 Claims, 2 Drawing Sheets

METHOD OF MANUFACTURING A CIRCUIT CARRYING SUBSTRATE HAVING COAXIAL VIA HOLES

TECHNICAL FIELD

This invention relates in general to electrical interconnections, and more particularly to a method of manufacturing multilayer printed circuit boards.

CROSS REFERENCE TO RELATED APPLICATION

This application is related to U.S. application Ser. No. 8/221,592 filed Apr. 1, 2994, and now abandoned, filed concurrently herewith, entitled "Circuit Carrying Substrate Having Coaxial Via Holes", by Suppelsa et al., and assigned to Motorola, Inc.

BACKGROUND

Multilayer printed circuit boards (PCB) have emerged as a solution to the problem of interconnecting miniature electronic components into complex systems. The area of application which shows multilayer PCBs to the greatest advantage is the interconnection of integrated circuits. Integrated circuits and multilayer PCBs can provide drastic reductions in the overall size and weight of a complete system. They find applications in high end electronics such as large computers, military equipment, and are increasingly found in consumer electronics. The multilayer technique makes more than two planes (normally 3-12) available to the PCB designer for running conductors and making large ground or supply areas, very useful in high speed circuitry. However, since multilayers represent the most complex type of PCB, their cost is very high, owing to the complexity of the manufacturing process and the lower production yields.

Multilayer PCBs are manufactured using a large number of steps and processes. Basically, the multilayer PCB is made by laminating several thin sublayers together. Copper clad laminates are normally used to make the etched circuitry layers, and are bonded together with prepreg or bonding sheets. To make a four layer PCB, for example, two single-sided laminates and one double-sided laminate are employed with two sheets of prepreg. The panel which forms the interior layer (the double sided laminate) is printed and etched on both sides, and locating holes are punched. A sandwich of all the panels is then made, consisting of (from bottom to top):

1) a panel with copper foil on one side, placed copper side down;
2) a sheet of prepreg;
3) the double sided etched panel;
4) another sheet of prepreg; and
5) a panel with copper foil on one side, placed copper side up.

This sandwich is inserted between the plates of a laminating press, similar to those used in the manufacture of conventional copper clad laminates, and is heated and pressed for a period of time. During lamination, the heated resin softens and the applied pressure causes it to flow and bond the panels together. Meanwhile, the polymerization reactions of the resins take place and the material hardens. The sandwich is then cooled and removed from the press. The resulting single strong panel has the two internal etched copper layers centrally embedded in the resin. The panel is then drilled, and the drilled holes are metallized to provide the electrical connections between the inner and the outer layers. The outer two layers are then etched to make the circuitry patterns. Further plating may then be taken up, to increase the thickness of the metallized holes. The resulting structure is shown in FIG. 1. Note that the two interior layers 5 are connected together by the metallized hole 7, which also further connects them to the exterior two layers 8, 9.

While this construction provides a number of advantages, it also has certain disadvantages. As shown in FIG. 1, the plated through hole 7 connects the inner layers 5 to the outer layers 8, 9. If one desires to connect the two inner layers and separately connect the two outer layers, two holes would be needed, one for each set of connections. Obviously, two holes, and the associated annular rings, will take up more space on the PCB surface than one hole. Artisans have sought to use ever decreasing hole sizes in order to circumvent the need for additional real estate on the board surface when making these conventional connections. But small hole diameters increase the difficulty of plating metal in the holes, creating a trade-off between hole diameter (cost) and board size. Further, the lamination step is critical, because any lamination defects will result in breaks or fractures in the hole metallization, creating open circuits. There is no method of checking the quality of the connection between the hole plating and the internal layers, except by destructive microsectioning. Repairability of multilayers is also very low, except for defects on the external layers. Clearly, a need exists for a better, more efficient way to couple the inner layers and the outer layers in separate sets.

SUMMARY OF THE INVENTION

Briefly, according to the invention, there is provided a method of manufacturing a circuit carrying substrate having a coaxial via hole. The center core or inner layer of the circuit carrying substrate is a dielectric material that has a plated through hole or via coupling the two surfaces of the inner layer together. One side of the inner layer has a first metallization pattern and the other side has a second metallization pattern on it. The through hole is electrically conductive and connects portions of the first and second metallization patterns. The plated through hole is filled with a dielectric material. A first dielectric layer is formed on one side of the inner layer, and a second dielectric layer is formed on the other side of the inner layer, so that the dielectric layers cover the first and second metallization patterns and the filled via hole. A third metallization pattern is formed on the first dielectric layer, and a fourth metallization pattern is formed on the second dielectric layer. A second via hole is formed within the first via hole, substantially concentric to and electrically insulated from the first via hole, to electrically connect the third and fourth metallization patterns.

DETAILED DESCRIPTION OF THE PREFERRED EMBODIMENT

Figure 1:
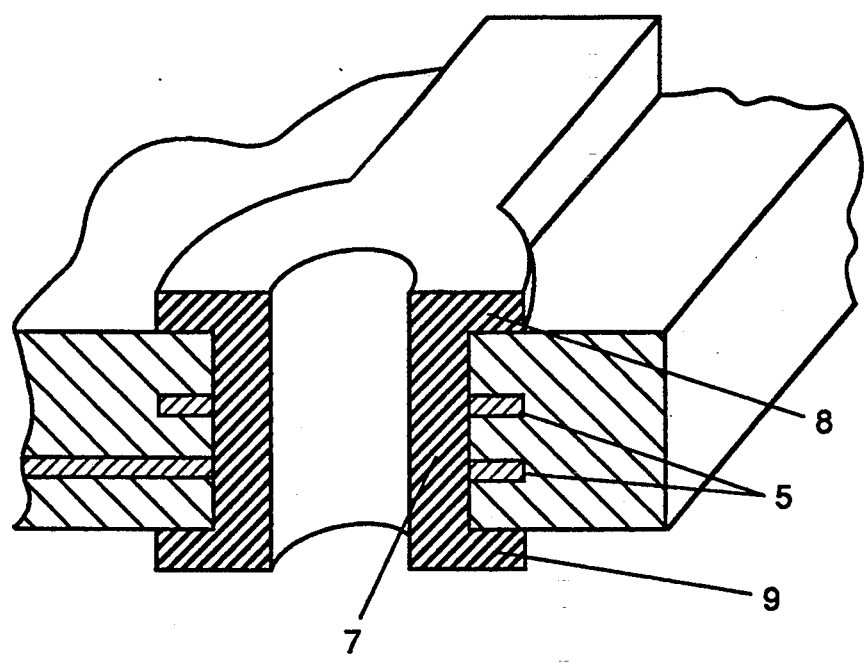
FIG. 1 is a cross-sectional view of a prior art multilayer printed circuit board.

While the specification concludes with claims defining the features of the invention that are regarded as novel, it is believed that the invention will be better understood from a consideration of the following description in conjunction with the drawing figures, in which like reference numerals are carried forward.

Figure 2:
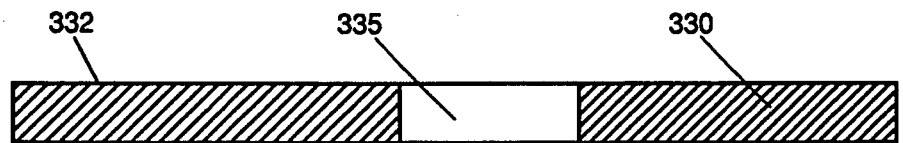
FIGS. 2–6 are cross-sectional views of the various stages of fabrication of a circuit carrying substrate having a coaxial via hole in accordance with the invention.
Figure 6:
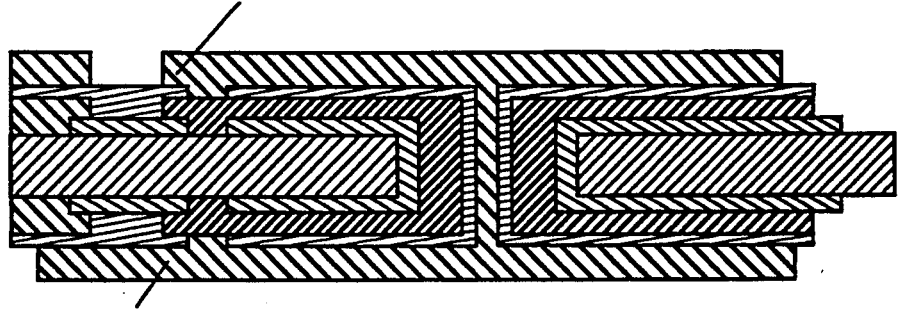

Starting with FIG. 2 and ending with FIG. 6, the preferred method of manufacture of a circuit carrying substrate having at least one coaxial via hole is illustrated. A coaxial via hole is a series of two or more concentric vias, that have a common center axis, but are electrically isolated from one another. In FIG. 2, an insulating substrate 330 contains a first opposing major surface 332 and a second opposing major surface 334, and a first hole 335 connecting the two surfaces 332, 334. The insulating substrate 330 is typically a material such as epoxy, polyimide, benzo-triazine resin, polytetrafluoroethylene, polyetherimide, cyanate ester, silicone or polyester. These materials are the resins typically used to make rigid printed wiring boards and are typically filled with glass fibers or glass matting, and are used when the final embodiment is a rigid circuit board. If the final embodiment is to be a flexible circuit, then no glass fiber reinforcement is used. Whether the starting substrate 330 is metallized or left unmetallized is the designer's choice, as either will perform equally, and the surfaces 332 and 334 can be metallized and circuitry defined on either or both sides using any of the practices known to those skilled in the art, such as: print and etch; photodelineate, plate, strip and etch of the preclad copper laminate; or co-metallized with the subsequent through hole metallization.

Figure 3:
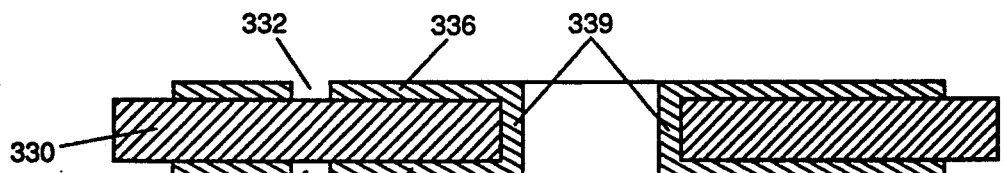

In FIG. 3, the walls of the first hole 335 are metallized with an electrically conductive material 339 that mechanically and electrically connects to a first metallization pattern 336 on the first major surface 332 and to a second metallization pattern 338 on the second major surface 334. A metallization pattern is a pattern of conductive material on a substrate surface used to interconnect electronic components, typically copper. The electrically conductive material 339 can be a material such as: electroless copper plus electroplated copper; sputtered chromium plus sputtered copper plus electroplated copper; evaporated chromium and copper plus electroplated copper; flame sprayed copper plus electroplated copper; conductive epoxy plus electroplated copper, or direct metallized palladium plus plated cooper. The preferred material is electroless copper plus electroplated copper.

Figure 4:
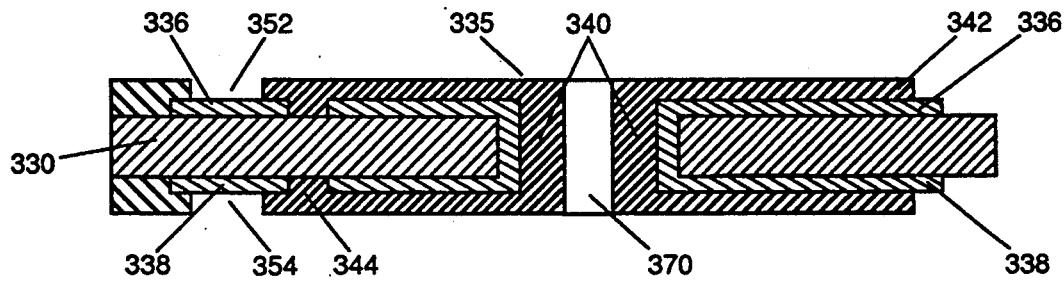

In FIG. 4 the void or empty portion of the metallized hole 335 is filled with a dielectric material 340 that has mechanical and thermal expansion properties similar to that of the base insulating substrate 330. The electrical, optical, and magnetic properties of the hole filling dielectric material 340 can be different than that of the base insulating material 330, however it is preferred that it be similar in nature and magnitude. The hole filling dielectric material 340 can be a slurry of ground and chopped prepreg similar to that used to make the insulating substrate 330, or it can be a material similar to the family of products known as Probimer ® or Probimage ™ primary resins sold by Ciba-Geigy Corporation, Deer Park, N.Y.

A first dielectric layer 342 is now formed to contact and cover the first surface 332 and the first metallization patterns 336 contained on the first surface 332 and the corresponding outer surfaces of the hole filling dielectric 340. A second dielectric layer 344 is similarly formed to contact and cover the second opposing surface 334 and the second metallization patterns 338 contained on the second surface 334 and the corresponding surface of the hole filling dielectric 340. Substantially all of the conductive surfaces 336, 338, and 339 are covered and therefore insulated with the dielectric materials 342, 344, and 340. The dielectric material 342 and 344 can be sheets of prepreg similar to that used to make the insulating substrate 330, or it can be similar to the family of products known as Probimer ® or Probimage ™ primary resins sold by Ciba-Geigy Corporation, Deer Park, N.Y. In the preferred embodiment for flexible circuits, the dielectric material is Pyralux ® Photoimagable Coverlay (PIC) sold by E. I. duPont de Nemours & Co. Inc., Wilmington, Del. Both the hole fill dielectric, and top and bottom cover layers utilize this material. PIC is a dry, flexible, photosensitive film that is a blend of acrylic, urethane and imide-based chemistries. It is applied to the substrate under elevated temperature and pressure with a hot roller. An alternate dielectric material is any of the family of Probimer ® or other liquid photoimagable solder mask chemistry blends that are applied by curtain coating, dipping, squeegeeing, screen printing, or spraying. All of these photoimagable materials can be processed by first drying, then photoexposing, developing, and final curing.

An alternate method of creating the dielectric layers 342, 344 is to laminate a sheet of prepreg to the first and second surfaces 332, 334 of the substrate 330. This technology is similar to that employed in the manufacture of rigid or flexible printed circuit boards. In this alternate method, the preferred dielectric layer material is a sheet of the same epoxy coated glass fiber prepreg that was used to make the insulating substrate 330. The sheet is typically clad with copper foil on one side, and that side is left exposed in order to define the circuitry. The circuitry may be etched prior to laminating the dielectric layer 342 to the first surface 332, or it may be etched after the lamination step, depending on the type of process involved. The circuitry may also be formed by an additive process, wherein the metal is deposited electrolessly on the unclad dielectric material. These embodiments of the process might then involve the formation of a third metallization layer 350 (see FIG. 5) on the dielectric layer 342 prior to the application (lamination) of the dielectric layers 342 or 344 to the inner circuit carrying substrate 330.

Referring now to FIG. 4, a second hole 370 is formed by either drilling, or photoprocessing (as described in a previous paragraph), through the first dielectric layer 342, continuing through the hole filling dielectric 340, and continuing through the second dielectric layer 344, such that the second hole 370 is essentially coaxial to, or concentric with the first hole 335 that was initially formed through the insulating substrate 330. This second hole 370 is of a sufficiently smaller diameter than the first hole 335, such that all of the first hole metallization 339, and a uniform, continuous, void-free layer of the hole filling dielectric insulating material 340 remain intact after the formation of the second hole 370. Additional openings 352 can be formed through the first dielectric layer 342 to expose the first metal layer 336 if desired, and similarly, additional openings 354 can be formed through the second dielectric layer 344 to expose the second metal layer 338 if desired. If the photoimaged dielectric layer is used, the holes are formed by a photoimaging process. If the prepreg sheets are used to form the dielectric layer, the holes are formed in the dielectric prior to laminating to the inner substrate. The step of forming the coaxial via hole may also be performed by laser ablation, punching, or sand abrading.

Figure 5:
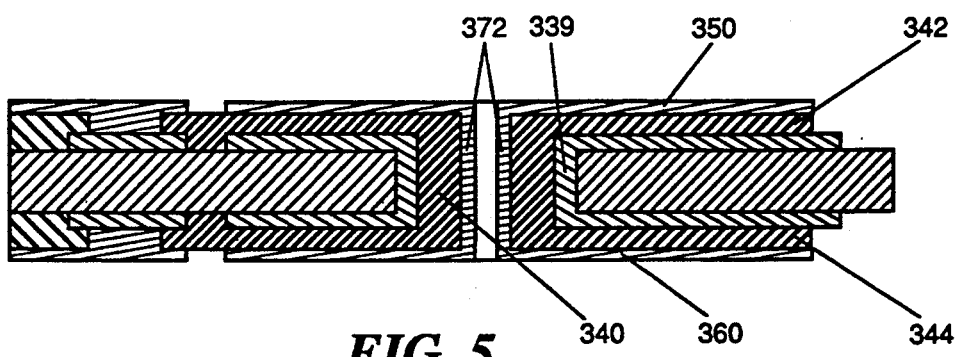

Referring now to FIG. 5, the second coaxial via hole 370 is metallized, plated, or filled with an electrically conductive material 372 that mechanically and electrically connects to a third metallization pattern 350 on the first dielectric layer 342. A fourth metallization pattern 360 is also formed on the second dielectric layer 344 in similar manner, and may also be connected to the coaxial via hole metallization 372. As shown in the drawing figure, the second hole metallization 372 is electrically isolated from first hole metallization 339 by dielectric material 340. The first metallization pattern 336 is electrically isolated from the third metallization pattern 350 by the first dielectric layer 342, and likewise, the second metallization pattern 338 is electrically isolated from fourth metallization pattern 360 by the second dielectric layer 344. The electrically conductive material 372 in the second hole can be electroless copper plus electroplated copper; direct deposited palladium plus electroplated copper; sputtered chromium plus sputtered copper plus electroplated copper; evaporated chromium and copper plus electroplated copper; flame sprayed copper plus electroplated copper; chromium plus copper plus nickel plus gold; or conductive epoxy plus electroplated copper. The preferred second hole metallization material 370 will be electroless copper plus electroplated copper.

The empty or void portion of the second metallized hole 370 can either be left untilled, or it may be filled with a dielectric material that has electrical, optical, magnetic, mechanical and thermal expansion properties similar to that of the dielectric material 340 that fills the first hole 335. Although it is preferred that the properties be similar in nature and magnitude, they can, if desired, be different.

The third metallization pattern 350 and the fourth metallization pattern 360 can be further coated, if desired, as shown in FIG. 6, with delineated insulating materials similar to dielectric layers 342 and 344, or other solder dam materials that define areas for the subsequent solder interconnection of other discreet passive and active components needed to form an electronic assembly. Metal circuitry layers 350, 360, and 372 are solderable conductive metallizations, preferably copper.

The process steps described heretofore can be repeated in like manner to fabricate third, fourth, and fifth additional concentric, or coaxial, insulated conductive vias within the two concentric vias already described, by repeating the hole fill and dielectric layer application, forming the through hole of diameter smaller than the diameter of all previous holes in the dielectric layers and filled hole, and metallizing the hole and additional circuitry. Portions of the final outer metallization of the preferred embodiment should be solderable, or contain a coating or plating of a solderable metallization.

Another alternate method is to start with a double sided circuit board as shown in FIG. 4 with properly designed and metallized plated through holes of sufficient diameter to allow for the construction of coaxial dielectric and metal layers within the same plated through via hole 335. All metal 339, 336, and 338 is preferred to be copper, but can be: silver; gold; chromium plus copper; chromium plus copper plus gold; or chromium plus copper plus nickel plus gold.

This new and novel method of manufacturing a coaxial via in a substrate provides a number of advantages. The coaxial plated through holes connect the inner metallization layers together, without requiring that they be connected to the outer metallization layers. The need for two holes, and the associated annular rings, is obviated, thus eliminating the need for more space on the PCB surface. Clearly, this invention satisfies a need for a better, more efficient way to make a substrate that couples the inner layers together and couples the outer layers in a separate set. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

We claim:

1. A method of manufacturing a circuit carrying substrate having a coaxial via, comprising:
   a) providing an electrically insulating substrate having first and second opposing major surfaces, and having a first metallization pattern on the first major surface and a second metallization pattern on the second major surface, and having a first electrically conductive via hole, connecting the first and second metallization patterns;
   b) filling the via hole with a dielectric material;
   c) providing a first dielectric layer on the first major surface and a second dielectric layer on the second major surface, the dielectric layers covering the first and second metallization patterns and the filled via hole;
   d) providing a third metallization pattern on the first dielectric layer;
   e) providing a fourth metallization pattern on the second dielectric layer;
   f) forming a second via hole within the first via hole, substantially concentric to and electrically insulated from the first via hole, the second via hole electrically connecting the third and fourth metallization patterns.

2. The method as described in claim 1, wherein steps b and c are performed in any order.

3. The method as described in claim 1, wherein steps d through f are performed in any order.

4. The method as described in claim 1, wherein steps c through e are performed in any order.

5. The method as described in claim 1, further comprising the steps of:
   g) filling the second via hole with a dielectric material;
   h) providing a third dielectric layer on the first dielectric layer and a fifth metallization pattern on the third dielectric layer.

6. The method as described in claim 5, further comprising the step of providing a fourth dielectric layer on the second dielectric layer and a sixth metallization pattern on the fourth dielectric layer.

7. The method as described in claim 6, further comprising the steps of:
   i) forming a third via hole within the second via hole, substantially concentric to and electrically insulated from the second via hole, the third via hole electrically connecting the fifth and sixth metallization patterns.

8. The method as described in claim 1, wherein the step of providing a metallization pattern comprises plating or sputtering metal.

9. The method as described in claim 1, wherein the step of providing a dielectric layer comprises providing a dielectric layer by laminating, roller coating, curtain coating, squeegeeing, spraying, dipping, overmolding, coextruding, or using a fluidized bed.

10. The method as described in claim 1, wherein the step (f) of forming a via hole is performed by drilling, photodelineation, laser ablation, punching, or sand abrading.

* * * * *